(12) United States Patent
Bahl et al.

(10) Patent No.: US 7,592,654 B2
(45) Date of Patent: Sep. 22, 2009

(54) REDUCED CROSSTALK CMOS IMAGE SENSORS

(75) Inventors: Sandeep R. Bahl, Loveland, CO (US);
Fredrick P. LaMaster, Loveland, CO (US); David W. Bigelow, Loveland, CO (US)

(73) Assignee: Aptina Imaging Corporation, Grand Cayman (KY)

( * ) Notice: Subject to any disclaimer, the term of this patent is extended or adjusted under 35 U.S.C. 154(b) by 3 days.

(21) Appl. No.: 11/940,569

(22) Filed: Nov. 15, 2007

(65) Prior Publication Data

US 2008/0079045 A1    Apr. 3, 2008

Related U.S. Application Data

(63) Continuation of application No. 11/197,004, filed on Aug. 4, 2005, now Pat. No. 7,307,327.

(51) Int. Cl.
| | |
|---|---|
| H01L 31/062 | (2006.01) |
| H01L 31/113 | (2006.01) |
| H01L 27/14 | (2006.01) |
| H01L 31/00 | (2006.01) |
| H01L 31/0232 | (2006.01) |
| H01L 27/15 | (2006.01) |
| H01L 29/26 | (2006.01) |
| H01L 31/12 | (2006.01) |
| H01L 33/00 | (2006.01) |
| H01L 29/417 | (2006.01) |
| H01L 29/732 | (2006.01) |
| H01L 27/148 | (2006.01) |

(52) U.S. Cl. .................. 257/291; 257/80; 257/81; 257/82; 257/113; 257/114; 257/115; 257/116; 257/117; 257/118; 257/184; 257/185; 257/186; 257/187; 257/188; 257/189; 257/222; 257/225; 257/233; 257/243; 257/257; 257/258; 257/290; 257/292; 257/293; 257/431; 257/432; 257/435; 257/446; 257/E27.128; 257/E27.129; 257/E27.133; 257/E27.134; 257/E27.135; 257/E27.136

(58) Field of Classification Search ............. 257/80–82, 257/113–118, 184–189, 222, 225, 233, 243, 257/257–258, 290–293, 431–432, 435, 446, 257/E27, 128, E27.129, E27.133, E27.134, 257/E27.135, E27.136
See application file for complete search history.

(56) References Cited

U.S. PATENT DOCUMENTS 5,859,462 A    1/1999   Tredwell et al.

(Continued)

FOREIGN PATENT DOCUMENTS

| EP | 1455389 | 9/2004 |
|---|---|---|
| EP | 1 750 308 A3 | 3/2009 |
| WO | WO 2005/001939 A1 | 1/2005 |

OTHER PUBLICATIONS

Search Report, EP 1750308, Reduced Cross Talk CMOS Image Sensors, Examiner Marek Kostrzewa, Feb. 2, 2009.

(Continued)

*Primary Examiner*—Ida M Soward
(74) *Attorney, Agent, or Firm*—RatnerPrestia

(57) ABSTRACT

CMOS image sensor having high sensitivity and low crosstalk, particularly at far-red to infrared wavelengths, and a method for fabricating a CMOS image sensor. A CMOS image sensor has a substrate, an epitaxial layer above the substrate, and a plurality of pixels extending into the epitaxial layer for receiving light. The image sensor also includes at least one of a horizontal barrier layer between the substrate and the epitaxial layer for preventing carriers generated in the substrate from moving to the epitaxial layer, and a plurality of lateral barrier layers between adjacent ones of the plurality of pixels for preventing lateral diffusion of electrons in the epitaxial layer.

16 Claims, 7 Drawing Sheets

U.S. PATENT DOCUMENTS

| | | |
|---|---|---|
| 6,252,286 B1 | 6/2001 | Arai |
| 6,403,998 B1 | 6/2002 | Inoue |
| 6,433,366 B1 * | 8/2002 | Takimoto et al. ............. 257/83 |
| 6,433,374 B1 | 8/2002 | Fukunaga et al. |
| 6,593,607 B1 | 7/2003 | Hseih |
| 6,639,293 B2 | 10/2003 | Furumiya et al. |
| 6,692,982 B2 * | 2/2004 | Takahashi et al. ............ 438/69 |
| 6,740,905 B1 | 5/2004 | Kaya et al. |
| 6,828,644 B2 * | 12/2004 | Asano et al. ................ 257/461 |
| 6,878,568 B1 | 4/2005 | Rhodes et al. |
| 7,164,447 B2 * | 1/2007 | Takahashi ................... 348/350 |
| 7,190,012 B2 * | 3/2007 | Son et al. .................... 257/292 |
| 7,342,268 B2 * | 3/2008 | Adkisson et al. ............ 257/291 |
| 7,382,007 B2 * | 6/2008 | Kitano et al. ............... 257/291 |
| 2003/0082882 A1 | 5/2003 | Babcock et al. |
| 2003/0197190 A1 | 10/2003 | Asano et al. |
| 2006/0145202 A1 | 7/2006 | Sawase |

OTHER PUBLICATIONS

Furumiya et al., "High Sensitivity and No-Crosstalk Pixel Technology for Embedded CMOS Image Sensor", IEEE Transactions on Electron Devices, vol. 48, No. 10, Oct. 2001, pp. 2221-2227.

Office Action With English Translation, Examiner Yan, Li-Gang, State Intellectual Property Office of the PRC (SIPO), Apr. 24, 2009.

* cited by examiner

REDUCED CROSSTALK CMOS IMAGE SENSORS

CROSS REFERENCE TO RELATED APPLICATIONS

This application is a Continuation of U.S. application Ser. No. 11/197,004, filed Aug. 4, 2005.

FIELD OF THE INVENTION

CMOS (Complementary Metal-Oxide Semiconductor) image sensors suffer from both reduced sensitivity and increased crosstalk in the far-red to infrared wavelength range (from about 700 nm to about 1 mm) because the absorption depth at these wavelengths is much larger than the pixel depth. Increased crosstalk occurs because light striking the image sensor penetrates well below the silicon surface of the sensor, and electron-hole pairs are generated deep within the substrate. These depths are well below the collection range of the pixels, and the photo-generated carriers are thus free to diffuse in all directions. The diffusion length of electrons for commonly used substrates is about 5 µm, and it is relatively easy for electrons to diffuse into adjacent pixels and cause crosstalk. The diffusion length in the lower-doped epi (epitaxial) layer can be much larger, and this can also have serious crosstalk consequences in an improperly designed image sensor. The sensitivity of a CMOS image sensor in the far-red to infrared wavelength range is also reduced because many of the deeply-generated carriers will recombine in the substrate and be lost.

Structures for reducing crosstalk in CMOS image sensors are typically based on making better camera chips for visible light. Usually, the dopant profile of the image sensor is tailored in such a way that a quasi-electric field in the undepleted region pushes carriers back into the photodiodes. Examples of known structures for reducing crosstalk in image sensors include providing deep array implants, providing a thin lightly doped layer on top of the substrate, implanting a deep p+ layer under blue and green pixels, but not under red pixels, and providing some form of multilayer structure. Such structures, while having some effectiveness in reducing crosstalk, also reduce the sensitivity of the image sensor, particularly at far-red to infrared wavelengths.

BRIEF DESCRIPTION OF THE DRAWINGS

Furthermore, the invention provides embodiments and other features and advantages in addition to or in lieu of those discussed above. Many of these features and advantages are apparent from the description below with reference to the following drawings.

DETAILED DESCRIPTION OF THE INVENTION

A CMOS image sensor having high sensitivity and low crosstalk, particularly at far-red to infrared wavelengths, and a method for fabricating a CMOS image sensor. A CMOS image sensor in accordance with the invention has a substrate, an epitaxial layer above the substrate, and a plurality of pixels extending into the epitaxial layer for receiving light. The image sensor also includes at least one of a horizontal barrier layer between the substrate and the epitaxial layer for preventing carriers generated in the substrate from moving to the epitaxial layer, and a plurality of lateral barrier layers between adjacent ones of the plurality of pixels for preventing lateral diffusion of electrons in the epitaxial layer.

Exemplary embodiments in accordance with the invention provide a CMOS image sensor that has high sensitivity and low crosstalk, particularly at far-red to infrared wavelengths, and to a method for fabricating a CMOS image sensor.

Figure 1:
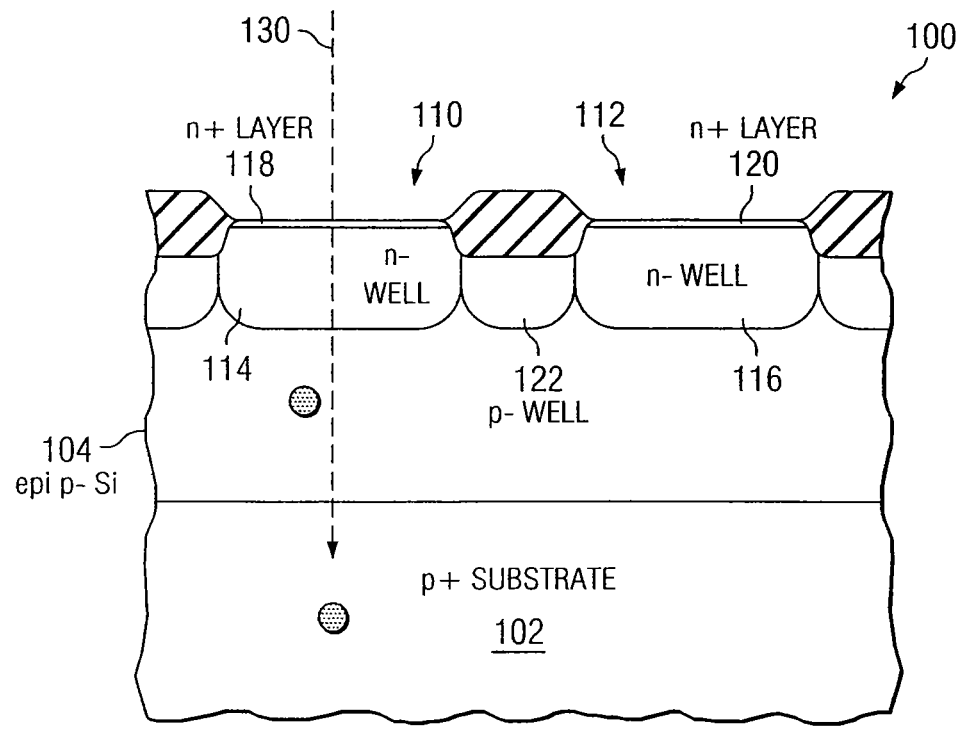
FIG. 1 is a schematic cross-sectional side view of a portion of a CMOS image sensor that is known in the art to assist in explaining the present invention.

FIG. 1 is a schematic cross-sectional side view of a portion of a CMOS image sensor that is known in the art to assist in explaining the present invention. The CMOS image sensor is designated by reference number 100 and generally includes substrate 102, epitaxial (epi) layer 104 above substrate 102 and a plurality of pixels (only two pixels 110 and 112 are illustrated in FIG. 1) arranged in an array and extending into epi layer 104. Substrate 102 and epi layer 104 are both composed of silicon semiconductor material; however, substrate 102 is made of P+ (highly doped P-type) semiconductor material), and epi layer 104 is made of P− (lightly doped P-type) semiconductor material.

Pixels 110 and 112 include photodiode n-wells 114 and 116, respectively, and surface implant regions 118 and 120, respectively, disposed on photodiode n-wells 114 and 116, to improve the contact to the pixels. Photodiode n-wells 114 and 116 are made of an N− (lightly-doped N-type) semiconductor material, and surface implant regions 118 and 120 are made of an N+ (highly-doped N-type) semiconductor material. A P-type semiconductor material (designated as P-well 122 in FIG. 1) is provided between pixels 110 and 112 to provide isolation between pixels.

As schematically illustrated in FIG. 1, when light 130 at far-red to infrared wavelengths (hereinafter generally referred to as infrared wavelengths) impinges pixel element 110, the light penetrates well below the silicon surface of image sensor 100, and electron-hole pairs are generated deep in substrate 102. These depths are well below the collection range of the pixels, and the photo-generated carriers are thus free to diffuse in all directions. The diffusion length of electrons for common substrates such as a heavily-doped silicon substrate 102 is about 5 µm, and it is relatively easy for a number of electrons to diffuse into adjacent pixels, such as pixel 112, and cause crosstalk. Furthermore, in CMOS image sensor 100, sensitivity is reduced because many of the deeply-generated carriers will recombine in the substrate and are lost, as distinguished from carriers generated in the epi layer which go to their own pixels as schematically illustrated in FIG. 1.

Figure 2A:
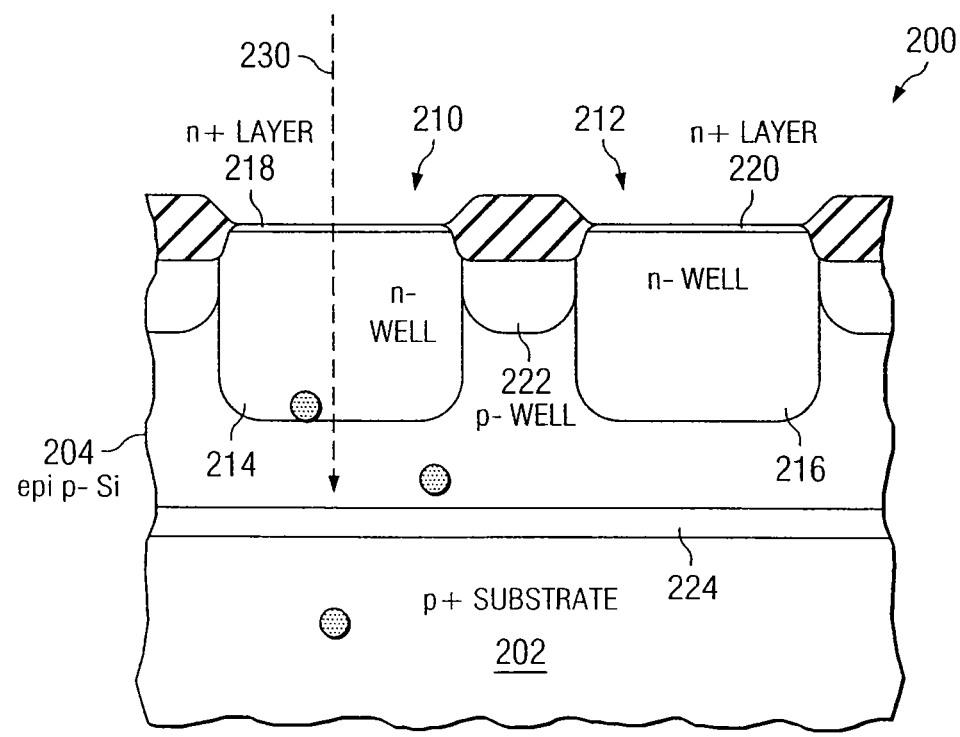
FIG. 2A is a schematic cross-sectional side view of a portion of a CMOS image sensor according to an exemplary embodiment in accordance with the invention.

FIG. 2A is a schematic cross-sectional side view of a portion of a CMOS image sensor according to an exemplary embodiment in accordance with the invention. The image sensor is generally designated by reference number 200 and, similar to CMOS image sensor 100 in FIG. 1, includes substrate 202, epi layer 204, and pixels 210 and 212 comprising photodiode n-wells 214 and 216 and surface implant regions 218 and 220, respectively, extending into epi layer 204. Also similar to CMOS image sensor 100 in FIG. 1, substrate 202 comprises a P+ silicon semiconductor material, epi layer 204 comprises a P− silicon semiconductor material, photodiode n-wells 214 and 216 are formed of an N− semiconductor material, and surface implant regions 218 and 220 are formed of an N+ semiconductor material. A P-type semiconductor material (designated as P-well 222) is provided between pixels 210 and 212 to provide isolation between pixels.

CMOS image sensor 200 in FIG. 2A differs from CMOS image sensor 100 in FIG. 1 in that epi layer 204 is thicker than epi layer 104 (for example, a thickness of from about 4 μm to about 20 μm, as compared to a thickness of about 2-6 μm in a typical CMOS image sensor such as image sensor 100 in FIG. 1), and includes deeper photodiode n-wells 214 and 216 (that extend into epi layer 204, for example, to a depth of from about 2 μm to about 10 μm, as compared to a depth of about 1-2 μm in a typical CMOS image sensor such as image sensor 100 in FIG. 1). The thicker epi layer and the deeper photodiode n-wells allow the depletion depth to penetrate well below the surface of the pixels.

Epi layer 204 is a lightly doped P-type material, and below the depletion depth, the doping is graded so as to provide an electric field to direct carriers. In addition, a horizontal barrier layer 224 is provided below the graded portion of the epi layer, between substrate 202 and epi layer 204. Horizontal barrier layer 224 functions to prevent carriers generated in substrate 202 below the horizontal barrier layer from diffusing up and into neighboring pixels and causing crosstalk.

Because of the increased depth of photodiode n-wells 214 and 216 in CMOS image sensor 200, a large number of carriers can be collected thus increasing the sensitivity of the image sensor. At the same time, electrons that are generated in substrate 202 below horizontal barrier layer 224, remain in the substrate and recombine. CMOS image sensor 200, accordingly, has both a higher sensitivity and reduced crosstalk at infrared wavelengths as compared to image sensor 100 in FIG. 1.

Figure 2B:
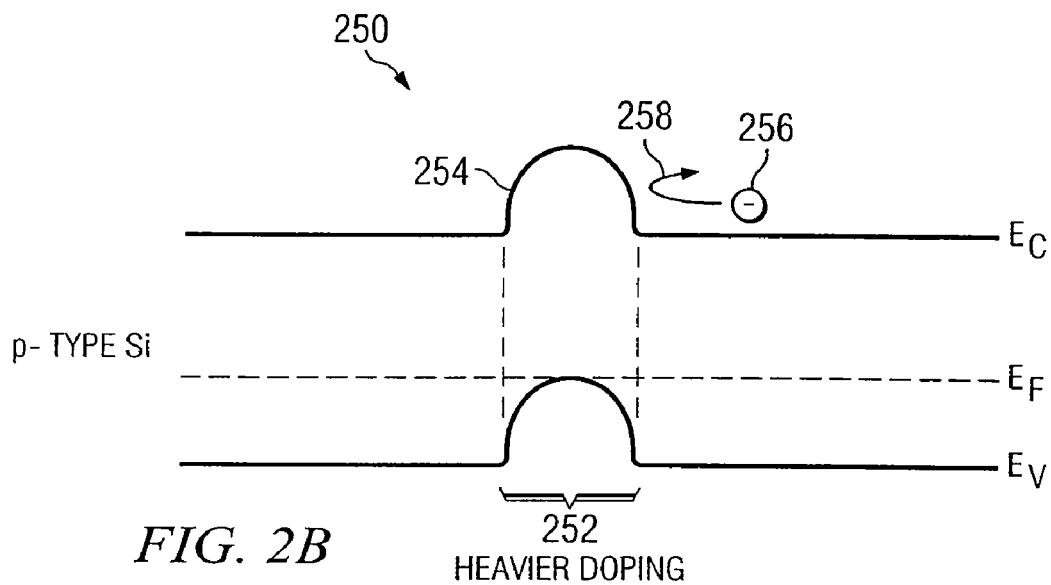
FIG. 2B schematically illustrates the functioning of a doping barrier in a P-type semiconductor to assist in explaining the present invention.

FIG. 2B schematically illustrates the functioning of a doping barrier in a P-type semiconductor to assist in explaining the present invention. As shown, the semiconductor, generally designated by reference number 250, includes heavier doping area 252, that creates a barrier 254 to, in effect, control the movement of electrons, such as electron 256. In particular, as illustrated by arrow 258, electron 256 does not cross barrier 254. In this way, barriers such as 254 may be used to prevent electrons from diffusing into neighboring pixels and causing crosstalk.

According to an exemplary embodiment in accordance with the invention, horizontal barrier layer 224 is provided by selective horizontal doping. To provide a highly effective barrier, a very heavily boron-doped layer having a thickness of from about 100 Å to about 1 μm, and doped in the range of about $10^{19}/cm^3$ to $10^{20}/cm^3$ is used. Barrier layer 224 must also be able to survive the thermal budget of a standard CMOS fabrication process, which is difficult to meet since the typical thermal budget will cause considerable boron diffusion such that boron would spread out and diffuse into the photodiode regions of the image sensor and decrease sensitivity. This out-diffusion would also reduce the amount of boron in the barrier layer and decrease its effectiveness. According to an exemplary embodiment in accordance with the invention, boron diffusion is reduced by alloying the barrier layer with carbon with a concentration less than about three percent.

Another problem that is encountered in connection with providing horizontal barrier layer 224 is that the addition of both boron and carbon decreases the lattice constant of silicon which will limit the thickness of the barrier layer. According to an exemplary embodiment in accordance with the invention, in order to reduce lattice stress while still limiting out diffusion of boron, a thicker barrier layer can be grown by strain-compensating it by the addition of Ge. In general, to limit diffusion and ease lattice strain, horizontal barrier layer 224 can, according to exemplary embodiments in accordance with the invention, include one or more of boron, aluminum, gallium, indium, phosphorus, arsenic, antimony, germanium and carbon.

According to a further exemplary embodiment in accordance with the invention, lattice stress can also be reduced while limiting out diffusion of boron by either capping or encapsulating the heavily boron-doped Si layer that provides the horizontal barrier layer on one or both sides by a thin carbon-containing layer. Yet further, a solid-source diffusion followed by capping with a C-doped (carbon doped) Si layer can be performed.

Figure 3:
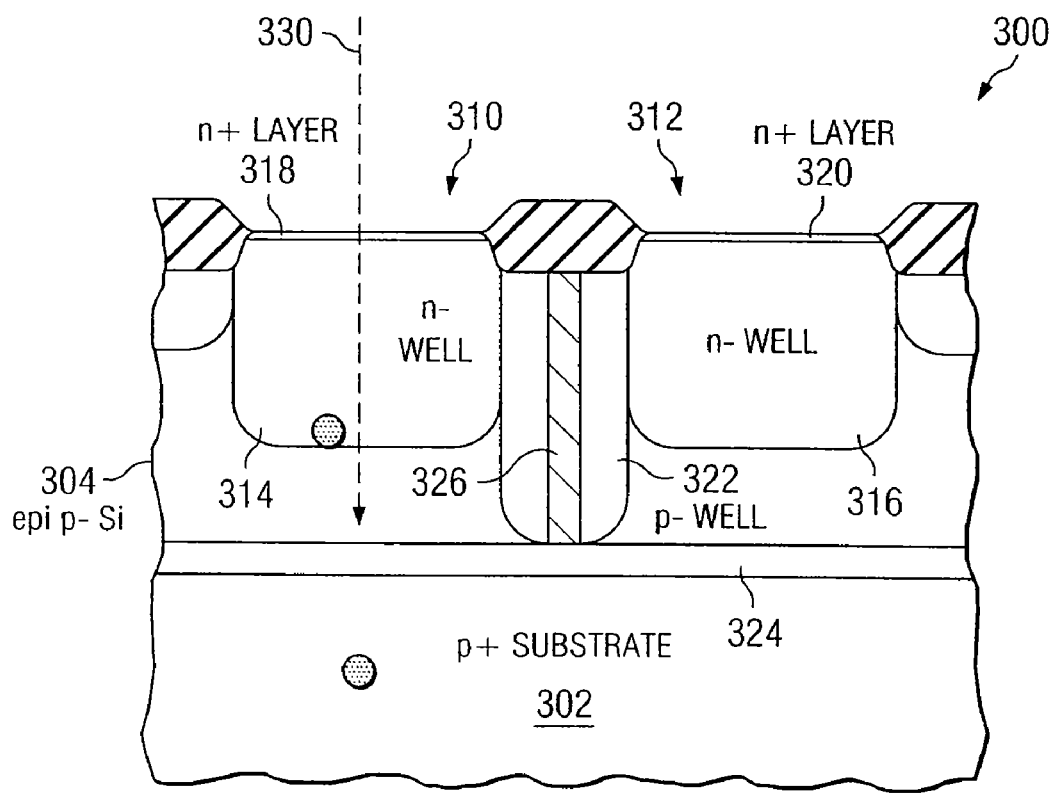
FIG. 3 is a schematic cross-sectional side view of a portion of a CMOS image sensor according to a further exemplary embodiment in accordance with the invention.

FIG. 3 is a schematic cross-sectional side view of a portion of a CMOS image sensor according to a further exemplary embodiment in accordance with the invention. The image sensor is generally designated by reference number 300, and is similar to CMOS image sensor 200 in FIG. 2A in that it includes substrate 302, epitaxial layer 304, horizontal barrier layer 324 between the substrate and the epitaxial layer, and pixels 310 and 312 comprising photodiode n-wells 314 and 316 and surface implant regions 318 and 320, respectively. Also similar to image sensor 200 in FIG. 2A, substrate 302 comprises P+ silicon semiconductor material, epi layer 304 comprises a P− silicon semiconductor material, horizontal barrier layer 324 comprises a very heavily boron-doped layer, photodiode n-wells 314 and 316 are formed of an N− semiconductor material, and surface implant regions 318 and 320 are formed of an N+ semiconductor material. A P-type semiconductor material (designated as P-well 322) is provided between pixels 310 and 312.

CMOS image sensor 300 differs from CMOS image sensor 200 in that P-well 322 between adjacent pixels 310 and 312 extends much deeper than P-well 222 in FIG. 2A (to a depth, for example, of about 2 μm to about 20 μm below the surface, as compared to a depth of about 1-2 μm in a typical CMOS image sensor such as image sensor 100 in FIG. 1); and, in addition, includes a deep trench 326 in each P-well 322.

In particular, for deeper photodiode collection layers, as provided in CMOS image sensor 200, lateral diffusion in the epi layer will have the effect of increasing crosstalk. In image sensor 300, however, deep P-well 322 together with trench 326 function as a lateral barrier layer between adjacent pixels to prevent lateral diffusion between the pixels. The trench may have a thickness of from about 0.5 μm to about 5 μm, and the lateral barrier layer, including the P-well and the trench may have a thickness of from about 1 μm to about 10 μm.

According to an exemplary embodiment in accordance with the invention, deep trench 326 is preferably formed before providing the P-well isolation 322. This permits the boron to be inserted deep down into the device. Alternatively, one can deposit P-doped polysilicon as a trench-filler, and then the P-dopant in the polysilicon would be made to diffuse. Other trench fillers that can be used include silicon nitride and silicon dioxide. A doped $S_iO_2$ (borosilicate glass) can also be used to provide the boron.

In image sensor 300, the p-n junction or the depletion region from the n-wells should not reach the trench. This is because the surface of the trench contains surface states, and if the depletion region reaches them, they will cause leakage current to flow. This, in fact, is the main reason for diffusing the boron. The boron prevents the depletion region from the N-well from reaching the trench. The boron also helps with the pixel isolation, just as in the embodiments where there is no trench.

Figure 4:
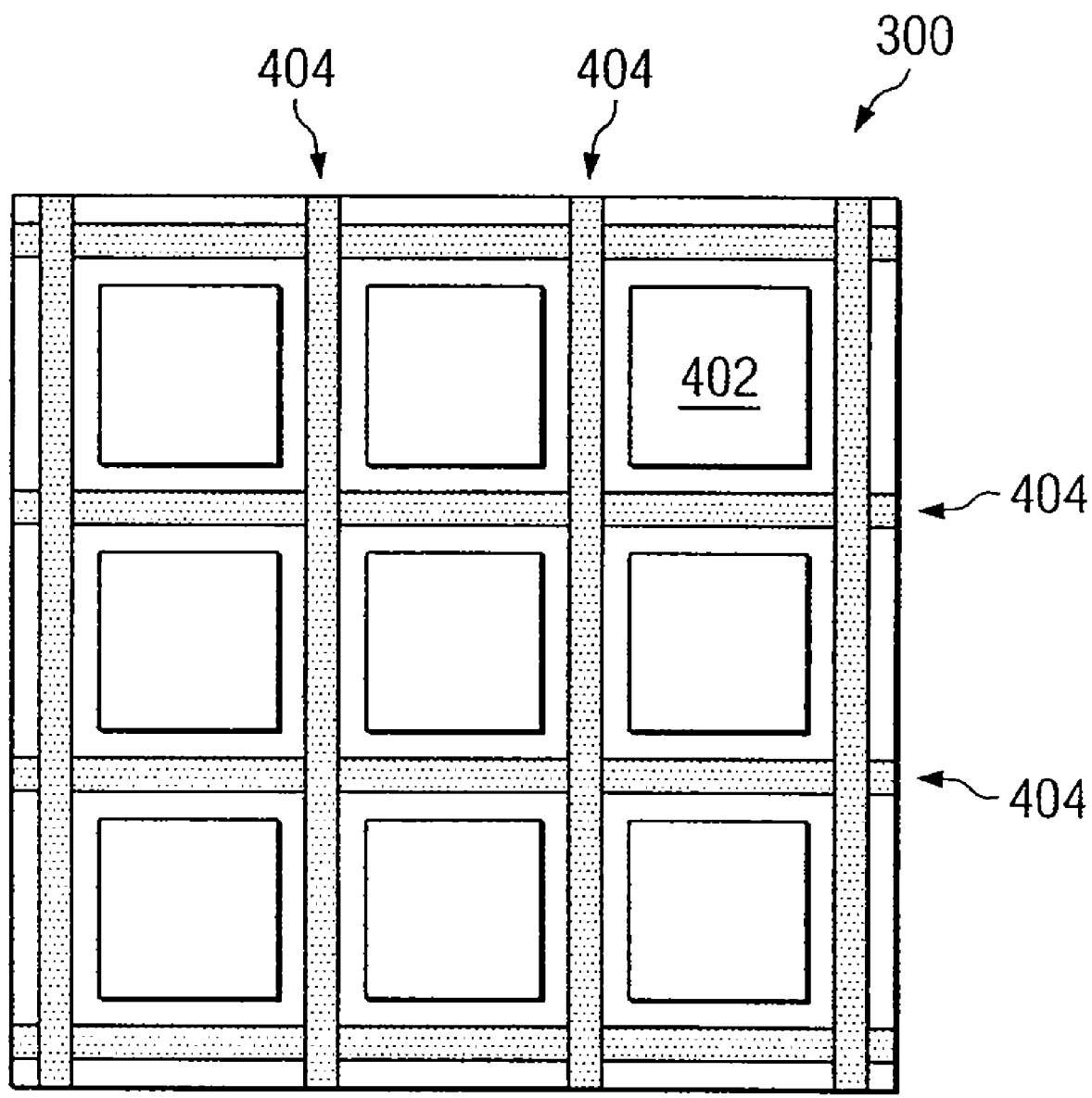
FIG. 4 is a schematic top view of a portion of the CMOS image sensor illustrated in FIG. 3.

FIG. 4 is a schematic top view of a portion of the CMOS image sensor illustrated in FIG. 3. In particular, FIG. 4, illustrates masks 404 provided between each of the plurality of pixels 402 in CMOS image sensor 300 to define trenches 326 in FIG. 3 that form the lateral barrier layers that prevent lateral diffusion between adjacent pixels.

CMOS image sensor 300 thus provides horizontal barrier layer 324 in conjunction with a thicker epi layer and deeper photodiode junctions to provide both high sensitivity and reduced crosstalk at infrared wavelengths, and lateral barrier layers defined by deep p-wells 324 and trenches 326 between adjacent pixels to reduce lateral diffusion between the deeper photodiodes.

Thus, according to exemplary embodiments in accordance with the invention, a CMOS image sensor having one or more of a horizontal barrier layer between the substrate and the epi layer of the image sensor, together with a thicker epi layer and deeper photodiode junctions; and lateral barrier layers between adjacent pixels provide the image sensor with increased sensitivity and reduced crosstalk, particularly for light in the far-red to infrared wavelength range. The invention is particularly suitable for motion detection applications, such as in an optical computer mouse, and infrared imaging applications such as in eye detection devices, that use a CMOS image sensor in conjunction with a low-cost infrared light source such as AlGaAs/GaAs for 780 or 840 nm, although it should be understood that the invention is not limited to use with any particular wavelength of light or in any particular application. An infrared light source is particularly desirable for eye detection applications in any event due to enhanced reflectivity by the retina and to enable eye measurements to be made without distracting the subject.

FIGS. 5-12 schematically illustrate steps of a method for fabricating a CMOS image sensor according to an exemplary embodiment in accordance with the invention. In particular, FIGS. 5-12 illustrate steps of a method for fabricating a CMOS image sensor having lateral barrier layers between pixels that do not include trenches as provided in image sensor 300 illustrated in FIG. 3.

Figure 5:
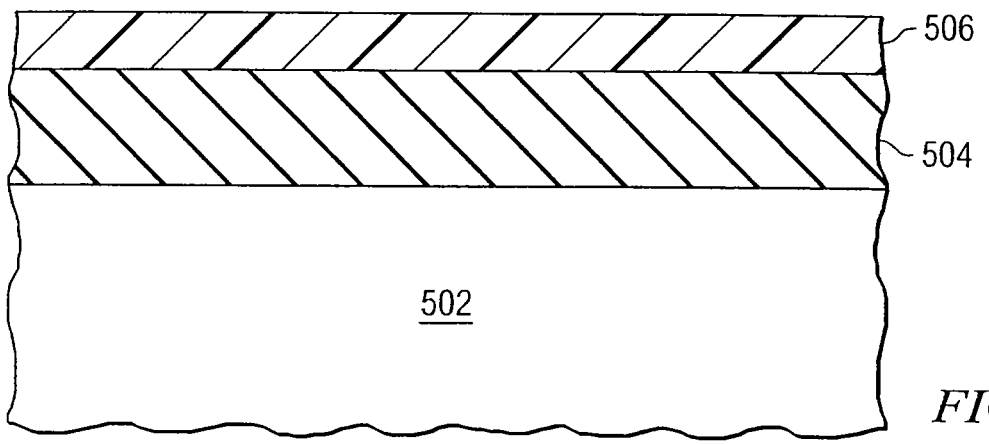
FIGS. 5-12 schematically illustrate steps of a method for fabricating a CMOS image sensor according to an exemplary embodiment in accordance with the invention.

With reference first to FIG. 5, a starting block of silicon heavily doped with boron to about 5E18 is initially provided as shown at 502. It should be understood that the present invention is not limited to boron as a P-type dopant. Other P-type dopants that can be used include aluminum, gallium and indium. Similarly, other N-type dopants that can be used include phosphorous, arsenic and antimony. A thermal oxide layer 504 is then grown on the silicon to a thickness of 10,000 Å and 5,000 Å of LTO (Low Temperature Oxide), and photoresist layer 506 is then applied on the oxide layer.

Figure 6:
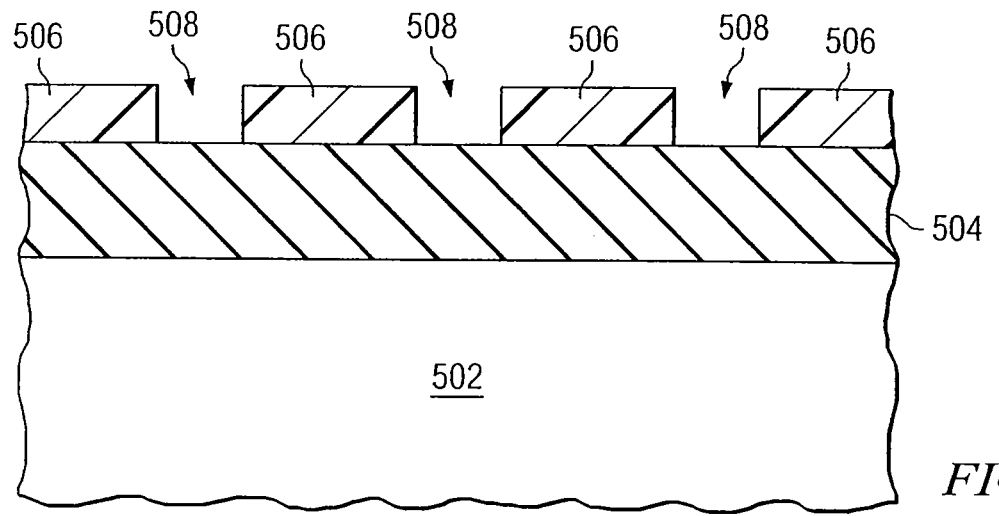
Figure 7:
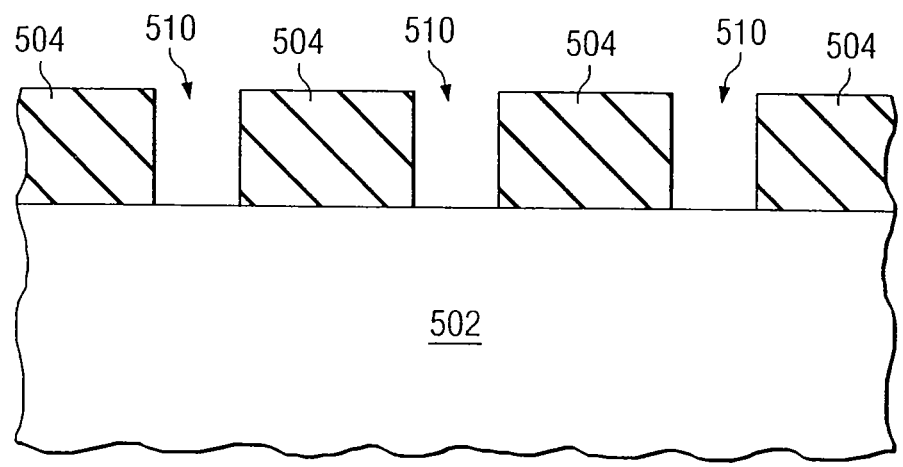

With reference to FIG. 6, a pattern is then developed in photoresist layer 506 as shown at 508. As shown in FIG. 7, the oxide layer is then etched as shown at 510, and photoresist layer 506 is then stripped as also shown in FIG. 7.

Figure 8:
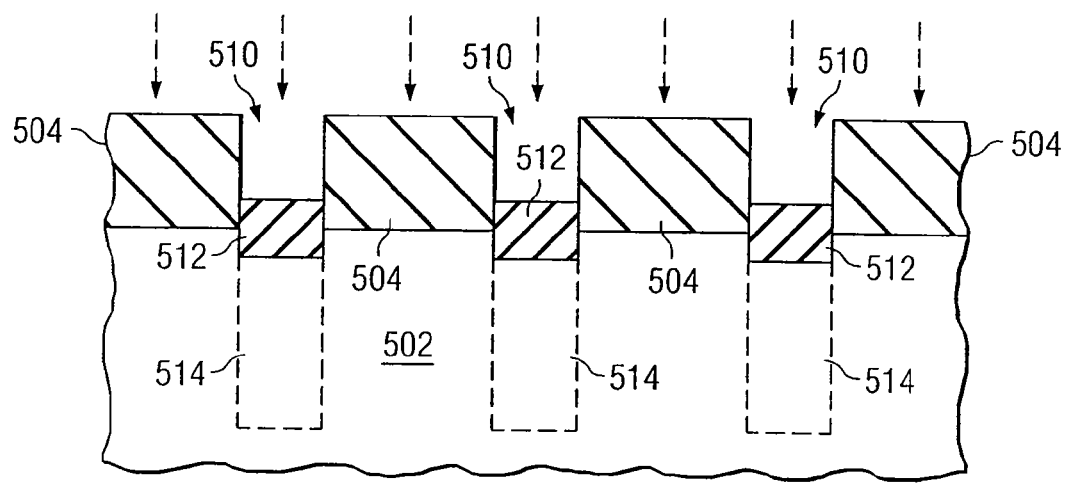

An implant oxide is then grown as schematically shown at 512 in FIG. 8. This will create a step in the silicon to align to after the epi layer is applied. Heavy doses of boron are then implanted at multiple energies. As schematically shown at 514, this allows the boron to penetrate to different depths and thereby form a lateral diffusion barrier. The implant doses and energies according to an exemplary embodiment in accordance with the invention are as follows: TABLE-US-00001 1. Energy 30 kev Dose 2.9E14 2. Energy 60 kev Dose 5.8E14 3. Energy 90 kev Dose 6.4E14 4. Energy 120 kev Dose 7.7E14 5. Energy 180 kev Dose1.15E15 6. Energy 240 kev Dose1.34E15

It should be recognized that the higher energy implants may be done by implanting double ionized Boron at half the energy level.

Figure 9:
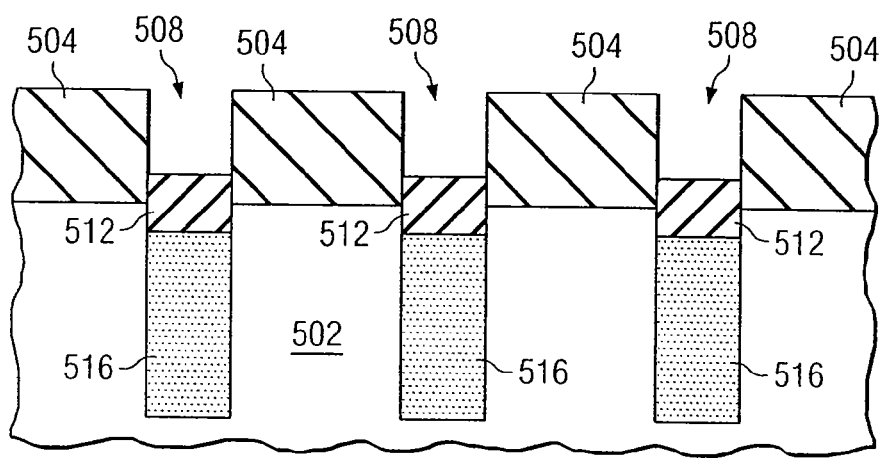

A high temperature annealing and diffusion of the implant is then performed as schematically illustrated at 516 in FIG. 9. The buried layer drive recipe according to an exemplary embodiment in accordance with the invention is as follows:
1. Load in N2 at 850 degrees C.
2. Ramp 5 degrees per minute in N2 to 1000 degrees C.
3. Anneal at 1000 degrees C. in N2 for 90 minutes
4. Ramp at 3 degrees C. per minute in N2 to 1125 degrees C.
5. Drive at 1125 degrees C. in N2 and 2.5% oxygen for 220 minutes
6. Ramp at 3 degrees C. per minute in N2 to 1000 degrees C.
7. Anneal for 240 minutes in N2 at 1000 degrees C.
8. Ramp at 3 degrees per minute in N2 to 850 degrees C.
9. Pull wafers in N2

Figure 10:
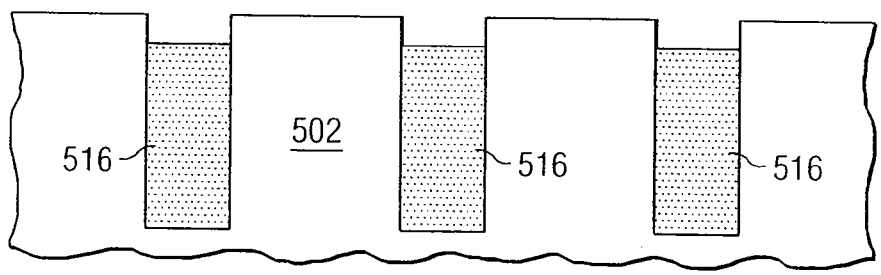
Figure 11:
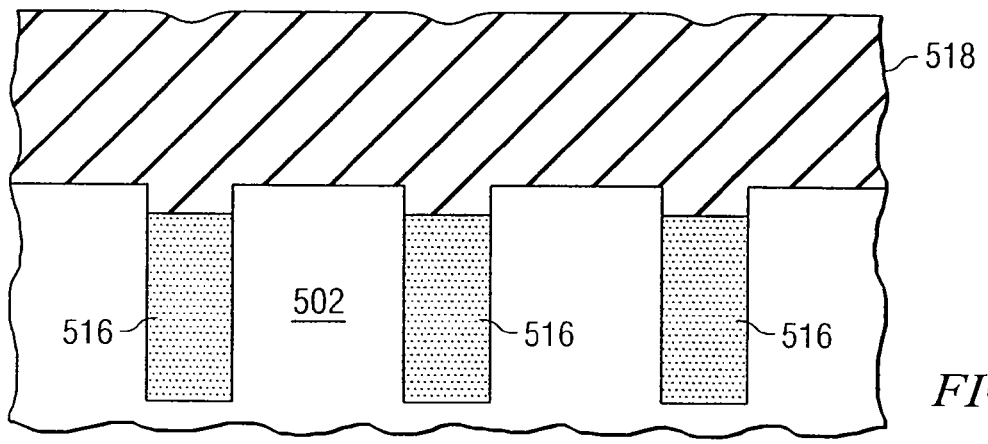
Figure 12:
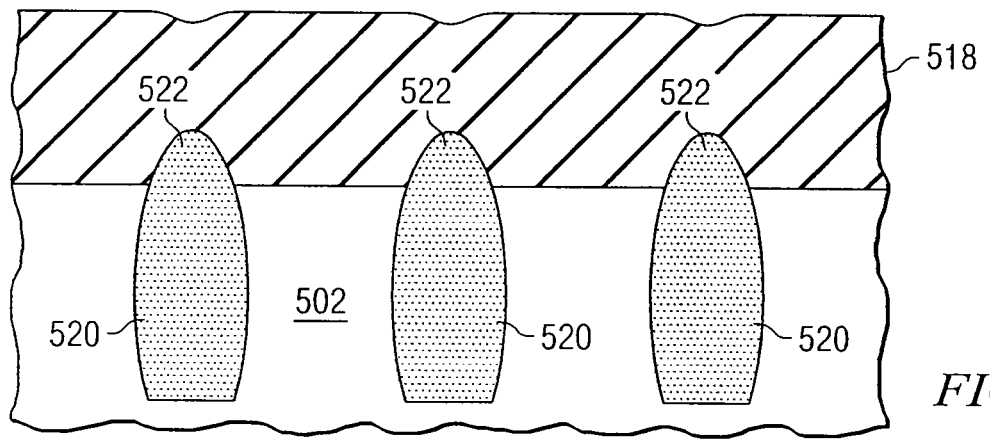

The oxide is then removed as shown in FIG. 10, and p-epi layer 518 is grown as shown in FIG. 11. After processing, the lateral barrier layers (lateral doping barriers) 520 diffuse as shown in FIG. 12. The upwardly extending extensions 522 help better confine electrons.

Figure 13:
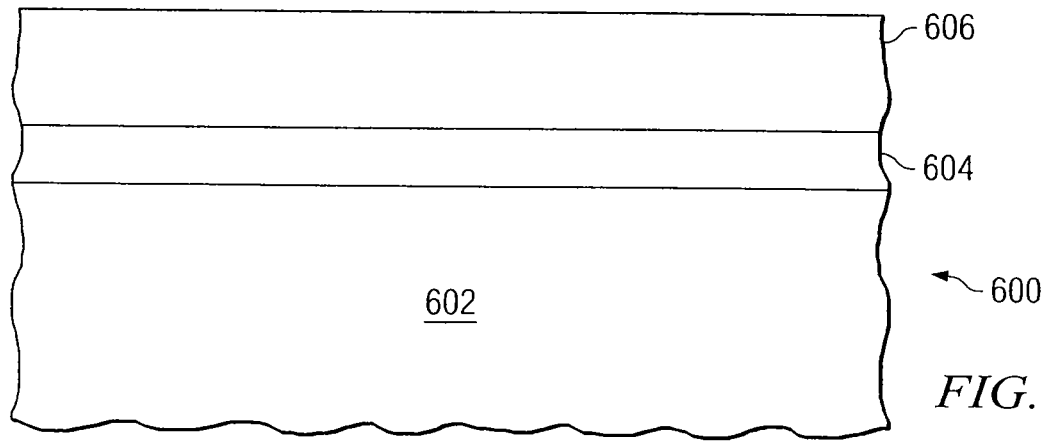
FIGS. 13-15 schematically illustrate steps of a method for fabricating a CMOS image sensor according to a further exemplary embodiment in accordance with the invention.
Figure 14:
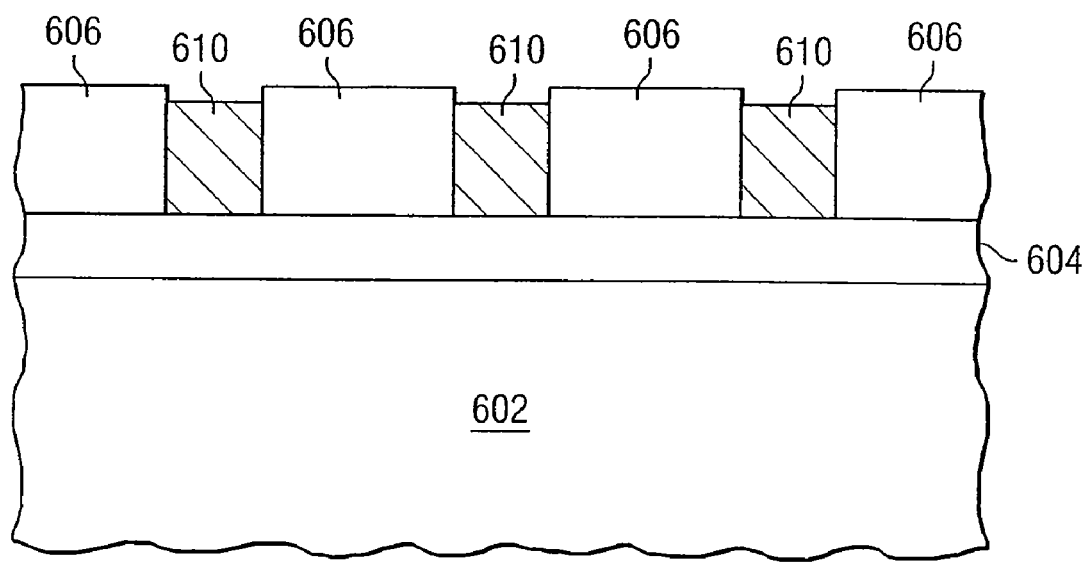
Figure 15:
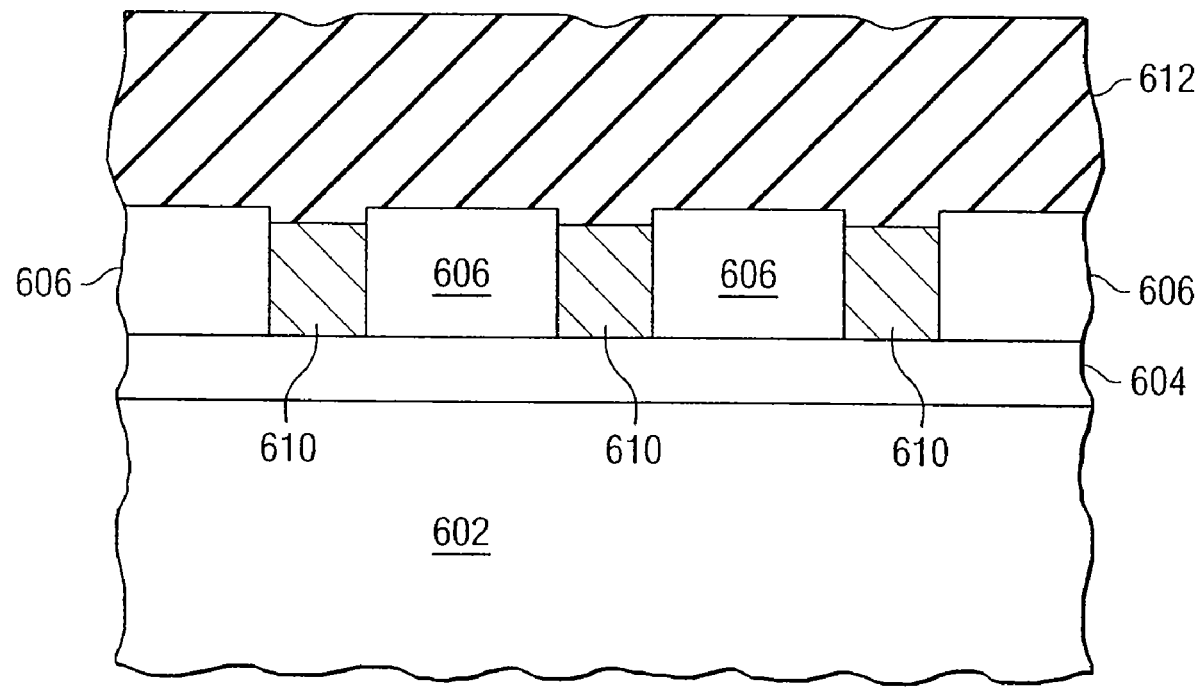

FIGS. 13-15 schematically illustrate steps of a method for fabricating a CMOS image sensor according to a further exemplary embodiment in accordance with the invention. In particular, FIGS. 13-15 schematically illustrate steps of a method for fabricating a CMOS image sensor having both a horizontal barrier layer between the substrate and the epi layer of the image sensor, and lateral barrier layers between adjacent pixels in the image sensor according to an exemplary embodiment in accordance with the invention.

Initially, as shown in FIG. 13 a very heavily doped horizontal barrier layer (>1 e19B) 604 is formed on top of a heavily doped silicon substrate (about.5e18B) 602. An epi layer 606 with either a fixed moderate or graded doping is then provided above horizontal barrier layer 604. A graded doping profile will provide an electric field to direct carriers upward and improve the collection efficiency.

The process for fabricating a CMOS image sensor with lateral barrier layers described above with reference to FIGS. 5-12 is then performed to provide lateral barrier layers 610 in epi layer 606 as shown in FIG. 14. Finally, a lightly doped photodiode epi is then grown as shown at 612 in FIG. 15 to complete the image sensor.

While what has been described constitute exemplary embodiments in accordance with the invention, it should be recognized that the invention can be varied in numerous ways without departing from the scope thereof. For example, although exemplary embodiments in accordance with the invention describe methods for fabricating CMOS image sensors, image sensors according to the invention can be fabricated in many different ways without departing from the scope of the present invention. In addition, specific properties of CMOS image sensors described herein can also be varied in many ways without departing from the invention. For example, the image sensors described herein can also be made using opposite doping types, i.e. an n+ substrate, an n– epi, an n-well isolation, p-well pixels and p+ contact. The barrier layer in such an image sensor would then be n+. In general, the term "CMOS image sensor" as used herein is intended to include any image sensor that can be fabricated in a CMOS process and that is compatible and integrable with CMOS electronics.

Because exemplary embodiments in accordance with the invention can be varied in numerous ways, it should be understood that the invention should be limited only insofar as is required by the scope of the following claims.

What is claimed:

1. A CMOS image sensor, comprising:
   a substrate;
   a single epitaxial layer above the substrate;
   a plurality of pixels extending into the epitaxial layer for receiving light;
   a horizontal barrier layer between the substrate and the epitaxial layer for preventing carriers generated in the substrate from moving to the epitaxial layer; and
   a plurality of lateral barrier layers between adjacent ones of the plurality of pixels for preventing lateral diffusion of electrons in the epitaxial layer, wherein the plurality of lateral barrier layers each comprise a deep P-well between adjacent pixels extending into the epitaxial layer, and
   the deep P-well is formed of P-dopant of a single conductivity type in the single epitaxial layer.

2. The CMOS image sensor according to claim 1, wherein the horizontal barrier layer comprises very heavily-doped silicon.

3. The CMOS image sensor according to claim 2, wherein the horizontal barrier layer includes one or more of boron, aluminum, gallium, indium, phosphorus, arsenic, antimony, germanium and carbon.

4. The CMOS image sensor according to claim 2, wherein the horizontal barrier layer is encapsulated on one or both sides by a carbon containing layer.

5. The CMOS image sensor according to claim 2, wherein the horizontal barrier layer has a thickness of greater than about 100 Å to less than 1 µm.

6. The CMOS image sensor according to claim 1, wherein the epitaxial layer has a thickness to about 20 µm, and wherein the plurality of pixels each include a well portion that extends into the epitaxial layer to a depth less than about 15 µm.

7. The CMOS image sensor according to claim 6, wherein doping in the epitaxial layer is graded below a depletion depth to provide an electric field to direct carriers.

8. The CMOS image sensor according to claim 1, wherein each of the plurality of lateral barrier layers further include trenches in the deep P-wells.

9. The CMOS image sensor according to claim 8, wherein the trenches of the plurality of lateral barrier layers are filled with at least one of polysilicon, silicon oxide and silicon dioxide.

10. The CMOS image sensor according to claim 1, wherein the light includes in a far-red to infrared wavelength range.

11. A CMOS image sensor, comprising:
    a substrate;
    a single epitaxial layer above the substrate;
    a plurality of pixels for receiving light, wherein the light comprises light in a far-red to infrared wavelength range, and wherein each of the plurality of pixels extend into the epitaxial layer;
    a horizontal barrier layer between the substrate and the epitaxial layer for preventing carriers generated in the substrate from moving to the epitaxial layer; and
    a plurality of lateral barrier layers between adjacent ones of the plurality of pixels for preventing lateral diffusion of electrons in the epitaxial layer, wherein the plurality of lateral barrier layers each comprise a deep P-well between adjacent pixels extend into the epitaxial layer, and
    the deep P-well is formed of P-dopant of a single conductivity type in the single epitaxial layer.

12. The CMOS image sensor according to claim 11, wherein the horizontal barrier layer comprises very heavily-doped silicon.

13. The CMOS image sensor according to claim 12, wherein the doping in the epitaxial layer is graded below a depletion depth to provide an electric field to direct carriers.

14. The CMOS image sensor according to claim 11, wherein the plurality of lateral barrier layers each comprise a deep P-well between adjacent pixels extending into the epi layer, and a lateral trench in each of the deep P-wells.

15. The CMOS image sensor according to claim 14, wherein the trenches of the plurality of lateral barrier layers are filled with at least one of polysilicon, silicon oxide and silicon dioxide.

16. The CMOS image sensor according to claim 11, wherein the epitaxial layer has a first thickness and the deep P-well extends into the epitaxial layer at a depth corresponding to the first thickness.

* * * * *